(12) United States Patent
Brunn (10) Patent No.: US 7,312,645 B1
(45) Date of Patent: Dec. 25, 2007

(54) ADAPTIVE TRANSITION DENSITY DATA TRIGGERED PLL (PHASE LOCKED LOOP)

(75) Inventor: Brian T. Brunn, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 815 days.

(21) Appl. No.: 10/737,386

(22) Filed: Dec. 16, 2003

(51) Int. Cl.
*H03L 7/06* (2006.01)

(52) U.S. Cl. ..................................... 327/147

(58) Field of Classification Search ............... 327/141, 327/147, 148, 151, 155, 156, 157, 160; 375/376; 713/400
See application file for complete search history.

(56) References Cited

U.S. PATENT DOCUMENTS

| | | | |
|---|---|---|---|
| 6,256,362 B1 * | 7/2001 | Goldman | 375/373 |
| 6,594,797 B1 | 7/2003 | Dudley et al. | |
| 7,227,387 B1 | 6/2007 | Alfke | |
| 2002/0125961 A1 * | 9/2002 | Jones et al. | 331/27 |
| 2002/0126787 A1 * | 9/2002 | Homol et al. | 375/376 |
| 2004/0085108 A1 * | 5/2004 | Murata et al. | 327/158 |

* cited by examiner

*Primary Examiner*—David C. Payne
*Assistant Examiner*—Aslan Ettehadieh
(74) *Attorney, Agent, or Firm*—Timothy W. Markison; Michael R. Hardaway

(57) ABSTRACT

Adaptive transition density data triggered PLL (Phase Locked Loop). A novel solution is presented within a data triggered PLL whereby the missing data edge transitions may be detected and used to modify a phase difference between a data signal and a feedback signal and/or a current of a CP (Charge Pump) thereby maintaining a substantially constant loop bandwidth of the PLL for varying data edge transition rates. In one embodiment, an estimation of a substantially linear shift in PLL phase relative to the data phase is employed in the absence of data edge transitions. Alternatively, other means of implementing the shifts may be employed (e.g., non-linear) as desired in particular applications. This solution provides for a data triggered PLL that is practically impervious to variations in data edge transition density.

8 Claims, 8 Drawing Sheets data triggered PLL (Phase Locked Loop)

PLL (Phase Locked Loop)
Fig. 1
(prior art)

Fig. 3
data triggered PLL (Phase Locked Loop)

Fig. 4

Fig. 5 programmable CP current (or on time) that adapts to data edge transition density within data triggered PLL

ADAPTIVE TRANSITION DENSITY DATA TRIGGERED PLL (PHASE LOCKED LOOP)

BACKGROUND OF THE INVENTION

1. Technical Field of the Invention

The invention relates generally to communication systems; and, more particularly, it relates to PLL (Phase Locked Loop) devices within such communication systems.

2. Description of Related Art

PLLs (Phase Locked Loops) are implemented within a wide variety of applications. Most generally, PLLs are employed to lock a frequency of a locally generated signal onto an incoming signal. This functionality may be important in a wide variety of contexts. For example, within data communication receivers (or transceivers), a locally generated signal is typically employed in some way such that the locally generated signal must be synchronized with a received signal that may be received via a communication channel or even simply via a bus (or other interconnection) that interconnects 2 or more devices.

Figure 1:
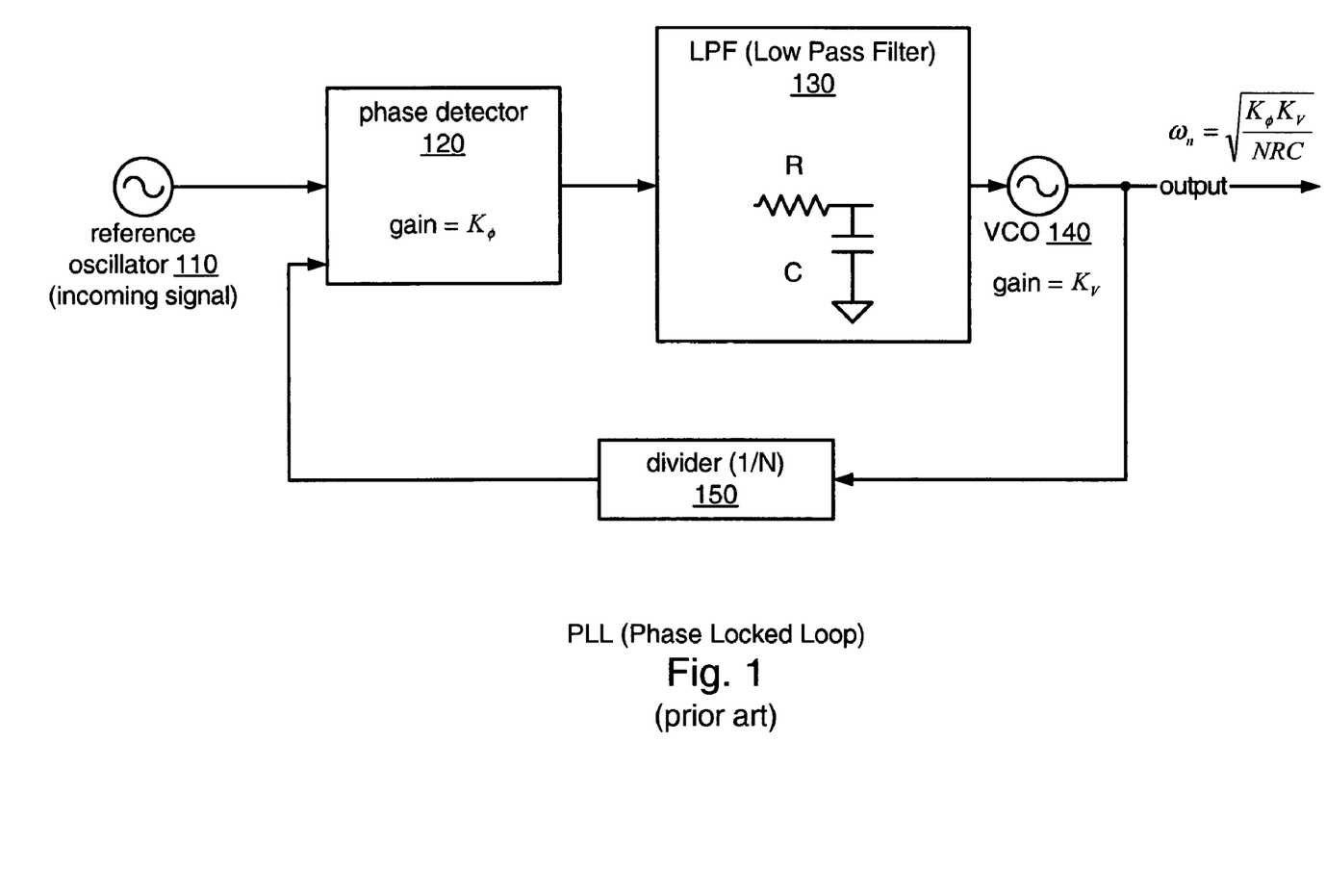
FIG. 1 is a diagram illustrating a prior art PLL (Phase Locked Loop).

FIG. 1 is a diagram illustrating a prior art PLL (Phase Locked Loop). The operation of a prior art PLL may be described as follows. The prior art PLL receives an incoming signal (shown as coming from a reference oscillator 110) and locks onto it and provides an output signal that is in phase with the incoming signal (e.g., the input signal). The prior art PLL includes a phase detector 120 (having conversion gain $K_\phi$, in Volts/radian), an LPF (Low Pass filter) 130 (sometimes referred to as a loop filter) that limits the frequency spectrum over which the signal is employed, a VCO (Voltage Controlled Oscillator) 140 (having voltage conversion constant $K_V$ in radian/S/Volt) that generates a local signal (shown as an output signal having a frequency of $$\omega_n = \sqrt{\frac{K_\phi K_V}{NRC}},$$

in radian/S) that corresponds to the incoming signal. In this embodiment, R (in Ohms) and C (in Farads) correspond to the values of the resistance and the capacitance of the resistor of the passive LPF 130 illustrated. The output of the VCO 140 is also provided to a divider 150 (that may be a divide by N counter), and the output of the divider 150 is a feedback signal that is used to adjust the phase detector 120 such that the frequency of the signal output from the VCO 140 is a multiple (by a factor of N) of the incoming signal.

The phase detector 120 of the prior art PLL detects the phase difference between the incoming signal to the PLL and the local signal generated by the VCO 140.

In general, a prior art PLL is an electronic circuit that synchronizes the signal from an oscillator (e.g., from the VCO 140) with a second input signal (called the "reference" or "incoming signal"), so that they operate at the same frequency, or multiples of the same frequency.

The loop synchronizes the VCO 140 to the input reference by comparing their phases and controls the VCO 140 in such a manner that a constant phase relationship is maintained between the two signals. If it is determined that the incoming signal and the local signal are in phase (e.g., the two clocks are in phase), then no phase adjustment need be performed. However, if the regenerated clock from VCO 140 lags the reference signal, then the phase adjuster needs to compensate for this by advancing the regenerated clock. If it leads the reference signal, the phase adjuster needs to make the opposite change.

From certain perspectives, PLL circuits are implemented and used for frequency control. They may be configured as frequency multipliers, demodulators, tracking generators or clock recovery circuits. A PLL is basically a feedback control system that controls the phase of the VCO 140. The input signal to the PLL is applied to one input of the phase detector 120. The other input to the phase detector 120 of the PLL is connected to the output of a divider 150 (that may be a divide by N counter) whose input is the output of the VCO 140. Normally the frequencies of both of these signals are nearly the same. The output of the phase detector 120 is pulse width proportional to the phase difference between these two inputs, and this output is applied to a loop filter that is shown as being an LPF (Low Pass Filter) 130 here. It is the combination of the VCO gain, the phase detector gain, the LPF loop filter value (e.g., the loop filter value), and the divider value that determines the dynamic characteristics of the PLL. The filtered signal controls the VCO 140. It is also noted that the output of the VCO 140 is at a frequency that is N times the signal supplied to the frequency reference input. This output signal is sent back to the phase detector 120 via the divider 150 (which may be a divide by N counter).

For additional understanding of the operation of the PLL, it is noted that the loop filter (shown here as the LPF 130) will be designed to match the characteristics required by the application of the PLL. For example, if the PLL is to acquire and track a signal, then the bandwidth of the loop filter will be greater than if it expects a fixed input frequency. The frequency range over which the PLL may lock onto is called the capture range. Once the PLL is locked, the range of frequencies that the PLL follows is called the tracking range. Generally the tracking range is larger than the capture range. The loop filter also determines how fast the signal frequency can change and still maintain lock. This is the maximum slewing rate. The narrower the loop filter bandwidth (or the lower the frequency range of the LPF 130), then the smaller the achievable phase error. This comes at the expense of slower response and reduced capture range.

Typically, the PLL is powered by a power supply that energizes the phase detector 120 and the VCO 140. In some embodiments, where the loop filter is implemented as an active device (e.g., NOT as the passive LPF 130 device as illustrated in this diagram), the power supply may also energize the active components contained therein. The power supply may be located on-chip with, or off-chip from, the PLL.

In some instances, a PLL is implemented to be triggered not off a received clock type signal (having a relatively constant periodicity, duty cycle, amplitude, frequency, and so on), but off of an incoming data signal (whose parameters may vary significantly over time). Such PLLs may generally be referred to as data recovery PLLs. These prior art data recovery PLLs are typically implemented using intelligent phase comparators that make updates only in the presence of data edge transitions. However, it can be very difficult to use a data signal as the reference signal (or incoming signal) to trigger a PLL.

From even a most general consideration, the density of data edge transitions of a digital data signal may be very varied. While the data edge transition density of a typical data signal may in fact be close to 50% (0.5 where a data edge transition occurs every 2 clock cycles) over a relatively long period of time, the data edge transition density within a more localized period of time may vary anywhere from 0% to 100%. That is to say, the number of data edge transitions that occur every period of time may vary from a value of up to 1.0 (e.g., a data edge transition every clock cycle) to a value of down to 0.0 (e.g., no data edge transitions at all within the period of time). When considering a relatively shorter period of time, the data edge transition density statistically is not close to the ideal of 50%. In addition, the PLL loop bandwidth varies as a function of the data edge transition density. That is to say, the loop bandwidth of the PLL is in fact dependent on the data edge transition density. When the data edge transition density is closer to 1, the PLL experiences the widest loop bandwidth because the loop gain is at the highest value. However, when the data edge transition density is closer to 0, the PLL experiences the most narrow loop bandwidth because the loop gain is at the lowest value. An additional loop parameter that varies with transition density is the damping/peaking and hence, the stability thereof. Stabilizing the damping factor generally increases the loop's stability.

In such instances, it can be seen that the local signal (shown as an output signal having a frequency of $$\omega_n = \sqrt{\frac{K_\phi K_V}{NRC}},$$

in radian/S) will vary as a function of the inverse of the square root of the factor N (e.g., $$\omega_n = \sqrt{\frac{1}{N}} \cdot \sqrt{\frac{K_\phi K_V}{RC}} = \sqrt{\frac{1}{N}} \cdot \text{constant value}).$$

In high performance systems, these variations in loop bandwidth may generate a great deal of deleterious effects. For example, in SONET (Synchronous Optical NETwork, a standard for optical telecommunications transport formulated by the ECSA (Exchange Carriers Standards Association) for the ANSI (American National Standards Institute)), the loop bandwidth is to maintained at less than 8 MHz (Mega-Hertz) and the damping factor is maintained large enough such that the PLL exhibits less than 0.1 dB of jitter transfer peaking. This loop bandwidth requirement inherently puts a significant constraint on the jitter of a VCO that may be implemented in such a PLL. In this SONET example, if the loop bandwidth varies, then the nominal loop bandwidth of the PLL must be placed lower then 8 MHz in an effort to compensate for those instances where the loop bandwidth may expand (based on changes in the data edge transition density). This also requires an even better VCO to meet the jitter specifications within the PLL.

As such, it can be seen that there are many limitations existent within the prior art of data recovery PLLs. A more robust and reliable approach is needed in the art to allow for high performance of data recovery PLLs in view of the variations in data edge transition density that may occur within the data signal by which such a PLL is triggered.

BRIEF SUMMARY OF THE INVENTION

Various aspects of the invention can be found in a data triggered phase locked loop (PLL). The data triggered PLL includes a phase detector, a CP (charge pump), a loop filter, a VCO (Voltage Controlled Oscillator), and an edge detection module. The phase detector is operably coupled to determine a phase difference between transitions of a data signal and a feedback signal. The CP is operably coupled to convert the phase difference into a charge pump current. The loop filter is operably coupled to convert the charge pump current into a control voltage. The VCO is operably coupled to convert the control voltage into a recovered clock, and the feedback signal is derived from the recovered clock. The edge detection module is operably coupled to detect missing transitions of the data signal and to alter at least one of the phase difference and charge pump current based on the missing transitions such that bandwidth of the data triggered PLL remains substantially constant for varying data signal transition densities.

In certain embodiments, the edge detection module performs various functions. For example, the edge detection module is operable to compare transitions of the recovered clock with transitions of the data signal. When a transition occurs in the recovered clock and a substantially contemporaneously transition does not occur in the data signal, edge detection module is operable to indicate a missing transition of the data signal. The edge detection module is also operable to increment a missing transition count of the data signal based on the indication of the missing transition until a transition of the data signal occurs substantially contemporaneously with another transition of the recovered clock to produce an accumulated missing transition count. At each transition of the data signal, the edge detection module is operable to establish a phase error scaling factor based on the accumulated missing transition count and a phase error-to-missing transition relationship.

The establishment of the phase error scaling factor may be established by assuming a linear shift in the PLL phase is assumed relative to the data phase in the absence of data edge transitions. In such an embodiment, the establishment of the phase error scaling factor may involve establishing a normalized phase error in accordance with the accumulated missing transition count as the phase error-to-missing transition relationship, such that the normalized phase error corresponds to (n+2)/2 for [0 . . . n], wherein n corresponds to a numerical value of the accumulated missing transition count. This establishment also involves summing the normalized phase error to produce the phase error scaling factor.

Moreover, the establishment of the phase error scaling factor may be established by providing a mathematical function that relates phase error to number of missing transitions as the phase error-to-missing transition relationship and solving the mathematical function for the accumulated missing transition count.

The phase detector of the data triggered PLL may include a phase offset module. This phase offset module is operably coupled to provide a phase offset to at least one of phase of the data signal and phase of the feedback signal based on the phase error scaling factor. This produces at least one of altered phase of the data signal and altered phase of the feedback signal. The phase detector may also include an up/down signal generation module operably coupled to produce an up signal when one of the following events occurs: (1) the altered phase of the data signal leads the phase of the feedback signal, (2) the phase of the data signal leads the altered phase of the feedback signal, or (3) the altered phase of the data signal leads the altered phase of the feedback signal. The phase detector may also include an up/down signal generation module operably coupled to produce a down signal when one of the following events occurs: (1) the altered phase of the feedback signal leads the phase of the data signal, (2) the phase of the feedback signal leads the altered phase of the data signal, or (3) the altered phase of the feedback signal leads the altered phase of the data signal.

The CP of the data triggered PLL may include a variable current source that is operably coupled to provide a variable source current to the loop filter based on a first state of the phase difference that corresponds to when phase of the data signal leads phase of the feedback signal, wherein magnitude of the variable source current is based on the phase error scaling factor. The CP may also include a variable current sink that is operably coupled to draw a variable sink current from the loop filter based on a second state of the phase difference that corresponds to when the phase of the feedback signal leads the phase of the data signal, wherein magnitude of the variable sink current is based on the missing transitions.

The invention envisions any type of devices that supports the functionality and/or processing described herein. Moreover, various types of methods may be performed to support the functionality described herein without departing from the scope and spirit of the invention.

DETAILED DESCRIPTION OF THE INVENTION

A novel approach is presented whereby an adaptive feedback signal is employed within a data triggered PLL (Phase Locked Loop). In one instance, a programmable CP (Charge Pump) is employed that adapts to the data edge transition density of the data signal that is used to trigger the PLL. The circuit adapts to changes in the data edge transition density by increasing the CP current as more and more data bits are received without data edge transitions. That is to say, as more and more data bits are received having missing data edge transitions, the CP current may be scaled (either by scaling the current itself or the on time of the CP) thereby ensuring lock within the data triggered PLL. Alternatively, a duration adjustment module may be employed that changes the duration of the data signal that is received and used as the trigger of the PLL. This duration adjustment module may be implemented as a scalable delay line such that varying amounts of delay may be added into the incoming signal to ensure that it maintains a high value and a low value at desired amounts of time.

In some embodiments, a linear shift in the PLL phase is assumed relative to the data phase in the absence of data edge transitions. When a certain number of missing edges is detected, then a linear extrapolation may be made such to adjust the phase of the PLL appropriately. Alternatively, non-linear extrapolation may be used based on additional information or understanding of a particular embodiment without departing from the scope and spirit of the invention. By employing this novel approach, the stability of the loop bandwidth of the data triggered PLL is maintained even in the presence of vast fluctuations in the data edge transition density.

Figure 2:
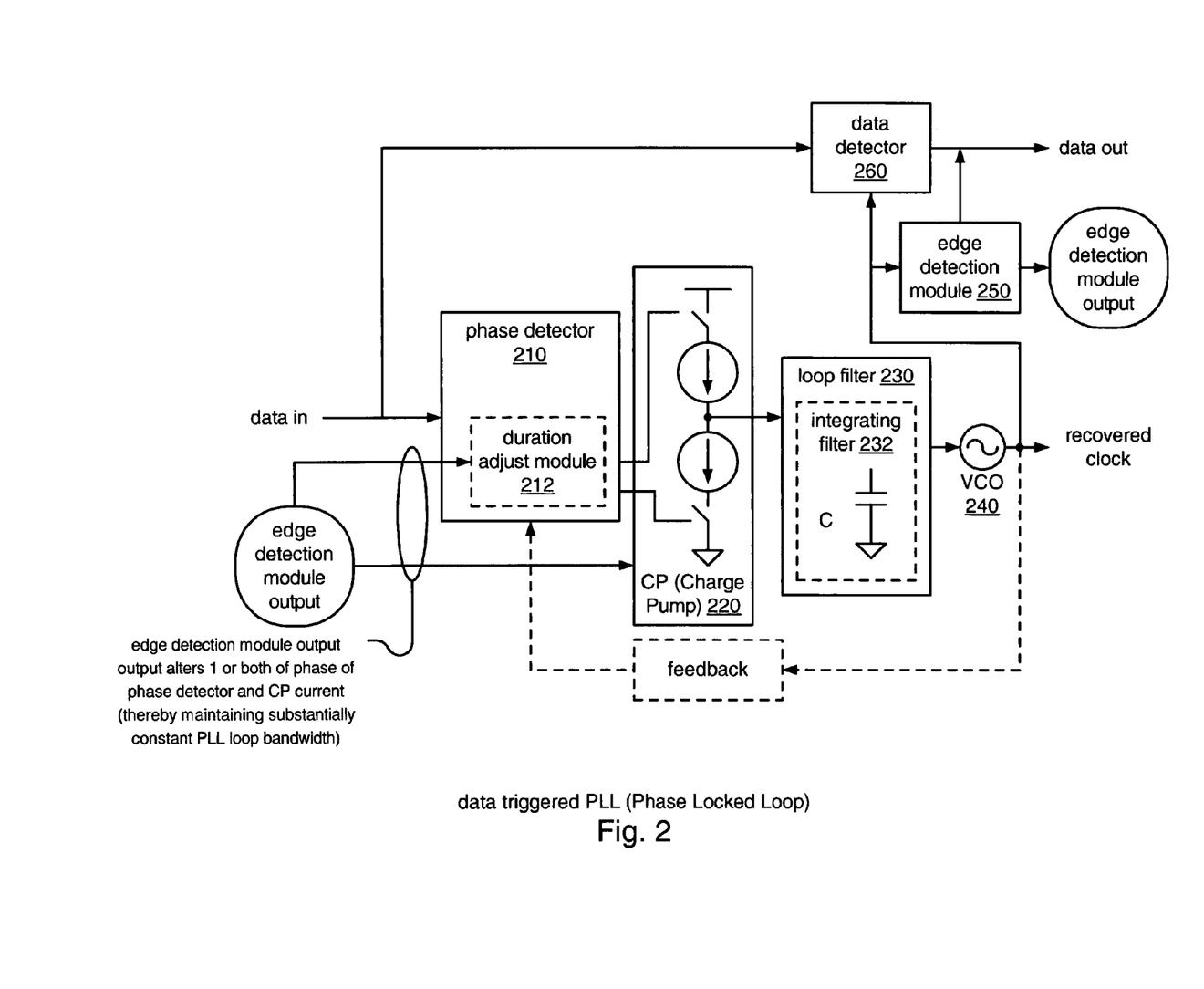
FIG. 2 is a diagram illustrating an embodiment of a data triggered PLL that is built according to the invention.

FIG. 2 is a diagram illustrating an embodiment of a data triggered PLL that is built according to the invention. In this embodiment the data trigger PLL uses a received data signal (shown as data in) as the trigger. This data signal is passed to a phase detector 210 that generates a voltage proportional to a phase difference between the data signal and a recovered clock. This data signal is also passed to a data detector 260 that detects data portions within this incoming data signal; the data detector 260 is operable to receive input instruction from an edge detection module 250 (that is described in more detail below). The phase detector 210 is operably coupled to determine a phase difference between transitions of the data signal (e.g., the incoming signal by which the PLL is triggered) and a feedback signal. This feedback signal is a signal that is derived from the recovered clock (as described in more detail below). The output of the phase detector 210 is provided to control a CP (Charge Pump) 220; the CP 220 is programmable based on an output signal from the edge detection module 250. The edge detection module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The edge detection module 250 may employ a memory that may be a single memory device or a plurality of memory devices. Such a memory device may be a ROM (Read-Only Memory), RAM (Random Access Memory), volatile memory, non-volatile memory, static memory, dynamic memory, flash memory, and/or any device that stores digital information. It is also noted that when the edge detection module 250 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the edge detection module executes 250 operational instructions corresponding to at least some of the steps and/or functions herein.

The CP 220 operates to convert the phase difference detected by the phase detector 210 into a charge pump current. The CP 220 delivers either positive or negative charge pulses depending on whether the reference signal phase leads or lags a feedback signal generated from the VCO signal. The VCO 240 is operably coupled to convert a control voltage provided from the CP 220 into a recovered clock. The output of the CP 220 is applied to a loop filter 230 that may be implemented as an integrating filter 232 (e.g., shown as using a capacitor shunted to ground). The loop filter 230 is operably coupled to convert the charge pump current into a control voltage. It is the loop filter 230 that determines the dynamic characteristics of the PLL. The output of the loop filer 230 is provided to drive the VCO 240.

The output signal from the VCO 240 is the recovered clock. The recovered clock may be employed as a feedback signal that is provided to the phase detector 210. In some instance, this feedback signal is a divided version of the recovered clock output from the VCO 240.

The edge detection module 250 is operably coupled to detect missing data edge transitions of the data signal and to alter at least one of the phase difference and CP current based on the missing transitions such that bandwidth of the data triggered PLL remains substantially constant for varying data signal transition densities. That is to say, the edge detection module 250 is operable to alter one or both of the phase differenced detected by the phase detector 210 and the current provided by the CP 220 thereby maintaining a substantially constant PLL loop bandwidth even in the presence of vast fluctuations in the data edge transition density.

Moreover, a duration adjust module 212 may be implemented, within the phase detector 210, to change the duration of the data signal that is received and used as the trigger of the PLL. This duration adjustment module 212 may be implemented as a scalable delay line such that varying amount of delay may be added into the incoming signal to ensure that it maintains a high value and a low value at desired amounts of time.

This embodiment described above shows how the edge detection module 250 may be operably situated near the output of the data triggered PLL.

Figure 3:
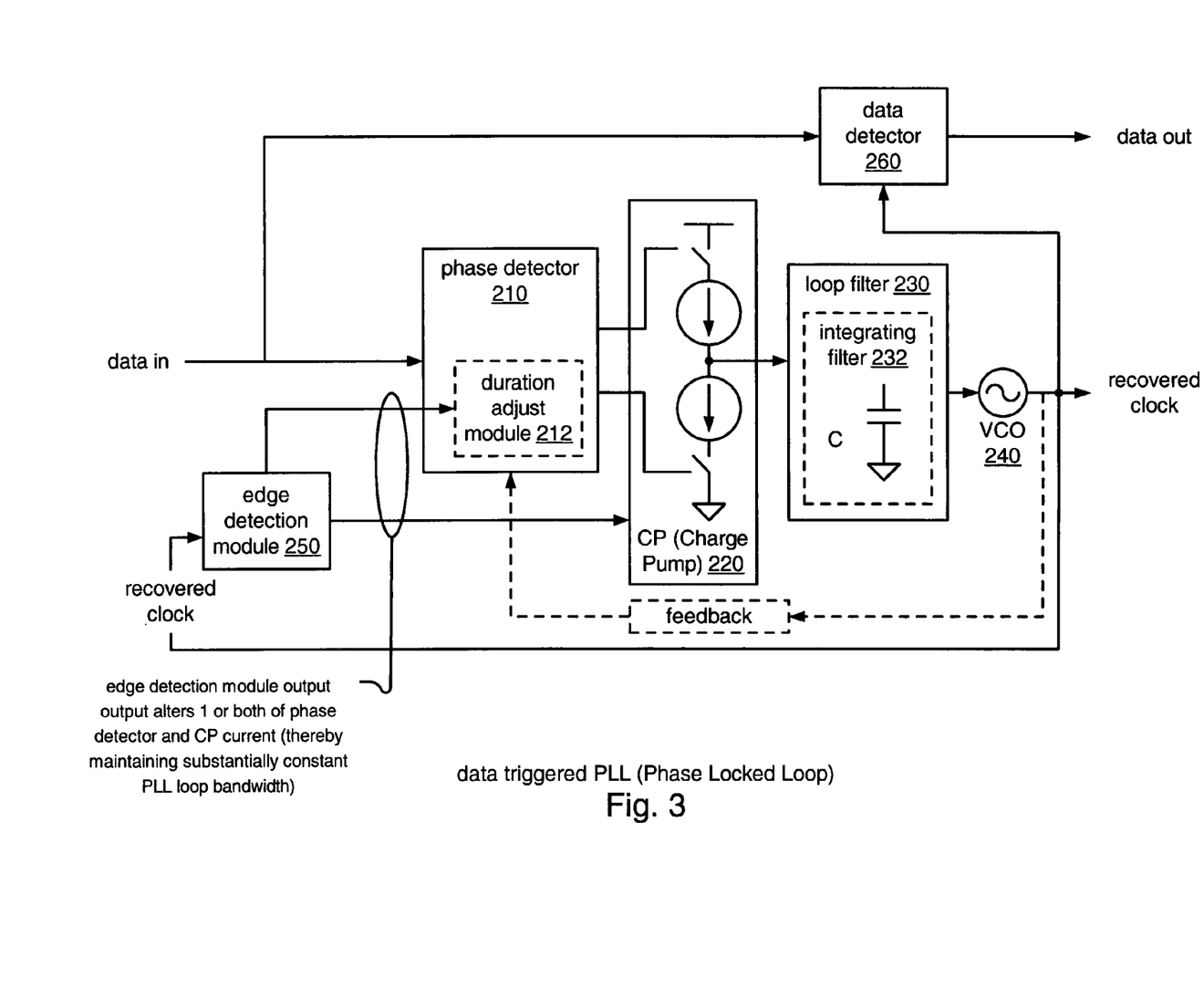
FIG. 3 is a diagram illustrating an alternative embodiment of a data triggered PLL that is built according to the invention.

FIG. 3 is a diagram illustrating an alternative embodiment of a data triggered PLL in accordance with the invention. This embodiment is similar to that embodiment described above except that the edge detection module 250 is operably situated near the input of the data triggered PLL. Functionally, the operation of this embodiment is similar, in that, the edge detection module 250 detects missing data edge transitions of the data signal and uses that information to alter one or both of the phase differenced detected by the phase detector 210 and the current provided by the CP 220 thereby maintaining a substantially constant PLL loop bandwidth.

Figure 4:
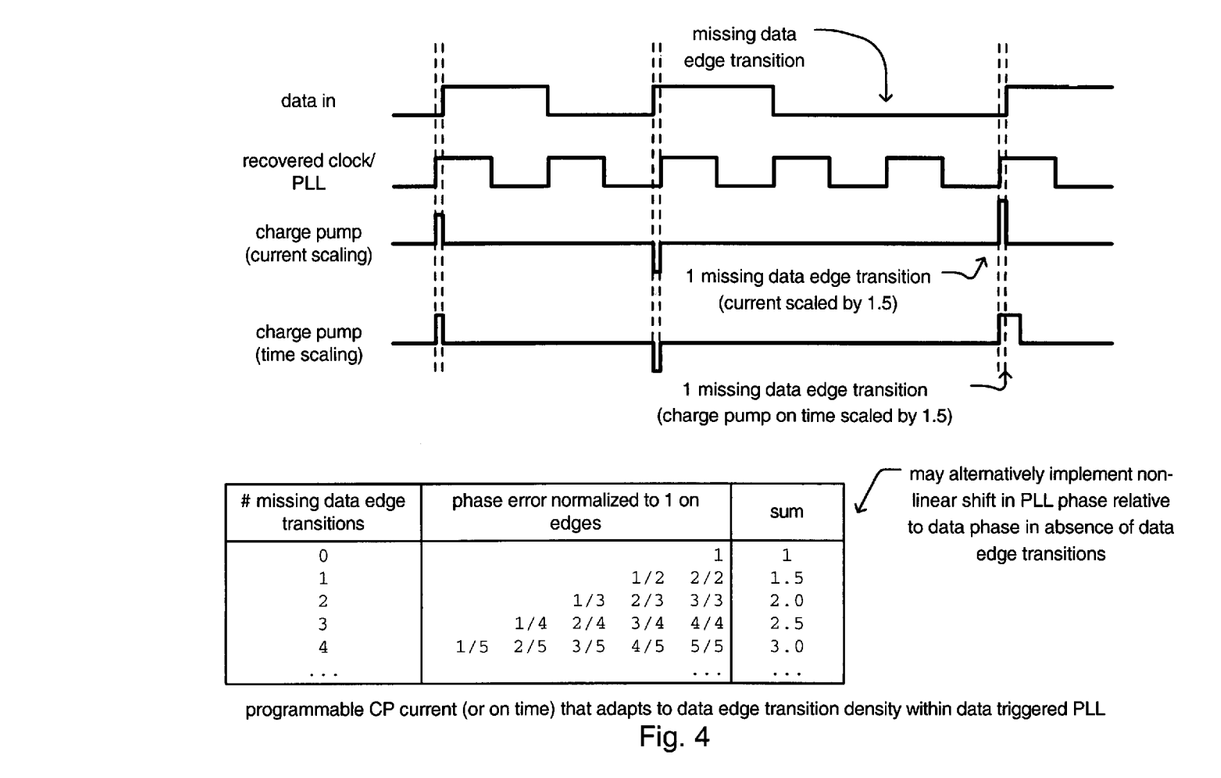
FIG. 4 is a diagram illustrating an embodiment of programmable CP (Charge Pump) current (or on time) that adapts to data edge transition density within a data triggered PLL that is built according to the invention.

FIG. 4 is a diagram (not to scale) illustrating an embodiment of programmable CP (Charge Pump) current (or on time) that adapts to data edge transition density within a data triggered PLL that is built according to the invention. This embodiment shows how a recovered clock (shown as a recovered clock/PLL signal), which may lead or lag a data in signal, is generated and modified by scaling a CP current or CP on time thereby maintaining lock of the data triggered PLL. As an edge detection module detect missing data edge transitions of the data in signal, a missing data edge transition count is kept and is then used to scale the CP current or CP on time upon the subsequent detection of a data edge transition. In this embodiment, a linear shift in PLL phase relative to the data phase is assumed in the absence of data edge transitions. However, in alternative embodiments, a non-linear shift in PLL phase relative to the data phase may be implemented when specific information is known about the particular application in which the data triggered PLL may be implemented. Moreover, when more specific information is known about the particular device in which the data triggered PLL is implemented, there may be instances where a non-linear shift in PLL phase relative to the data phase may be used.

For more detail of one possible implementation of the linear shifting in PLL phase relative to the data phase in the absence of data edge transitions, the following example is provided. When the edge detection module detects a missing data edge transitions, a missing data edge transition count is made and incremented keeping track of how many missing data edge transitions there has been before a data edge transition has been detected.

For example, when, over a period of time, there have been no missing data edge transitions, the phase error (normalized to 1 on the edges of the data edge transitions) that accumulates in phase, when divided across the period of time with no missing data edge transitions, is 1. The sum of the phase error is 1.

However, when, over a period of time, there has been 1 detected missing data edge transition, the phase error (normalized to 1 on the edges of the data edge transitions) that accumulates in phase, when divided across the period of time (when assumed to accumulate linearly) may be assumed to accumulate as ½ and 2/2, such that ½ of the phase error occurs when a single missing data edge transition is detected. The sum of the phase error may be described as being /1;2+/2;2=1.5.

Analogously, when, over a period of time, there have been 2 detected missing data edge transitions, the phase error (normalized to 1 on the edges of the data edge transitions) that accumulates in phase, when divided across the period of time (when assumed to accumulate linearly) may be assumed to accumulate as ⅓, ⅔, and ⅗, such that ⅓ of the phase error occurs at each missing data edge transition when 2 missing data edge transitions are detected. The sum of the phase error may be described as being ⅓+⅔+⅗=2.0.

The sum may be similarly made for any number of detected missing data edge transitions.

For 3 missing data edge transitions: ¼+2/4+¾+4/4=2.5;

For 4 missing data edge transitions: ⅕+⅖+⅗+⅘+5/5=3.0; and so on.

Mathematically, this may be described generically as follows. A normalized phase error may be generated in accordance with the accumulated missing transition count as the phase error-to-missing transition relationship. The normalized phase error may be represented as:

(n+2)/2 for [0 . . . n], such that n corresponds to a numerical value of the accumulated missing transition count.

As can be seen for various missing data edge transitions n:

$n=0: (0+2)/2=1$ $n=1: (1+2)/2=1.5$ $n=2: (2+2)/2=2.0$ $n=3: (3+2)/2=2.5$ $n=4: (4+2)/2=3.0$ and so on.

The scaling of the CP current is then made based on this missing data edge transition count that is then reset after a data edge transition is in fact detected.

A brief and illustrative example is provided here to illustrate how CP current may be scaled appropriately based on a missing data edge transition count:

For no missing edges, CP current operates at nominal value: 100 μA.

For 1 missing edge, CP current scaled by 1.5; CP current: 150 μA.

For 2 missing edge, CP current scaled by 2.0; CP current: 200 μA.

For 3 missing edge, CP current scaled by 2.5; CP current: 250 μA.

For 4 missing edge, CP current scaled by 3.0; CP current: 300 μA.

Figure 5:
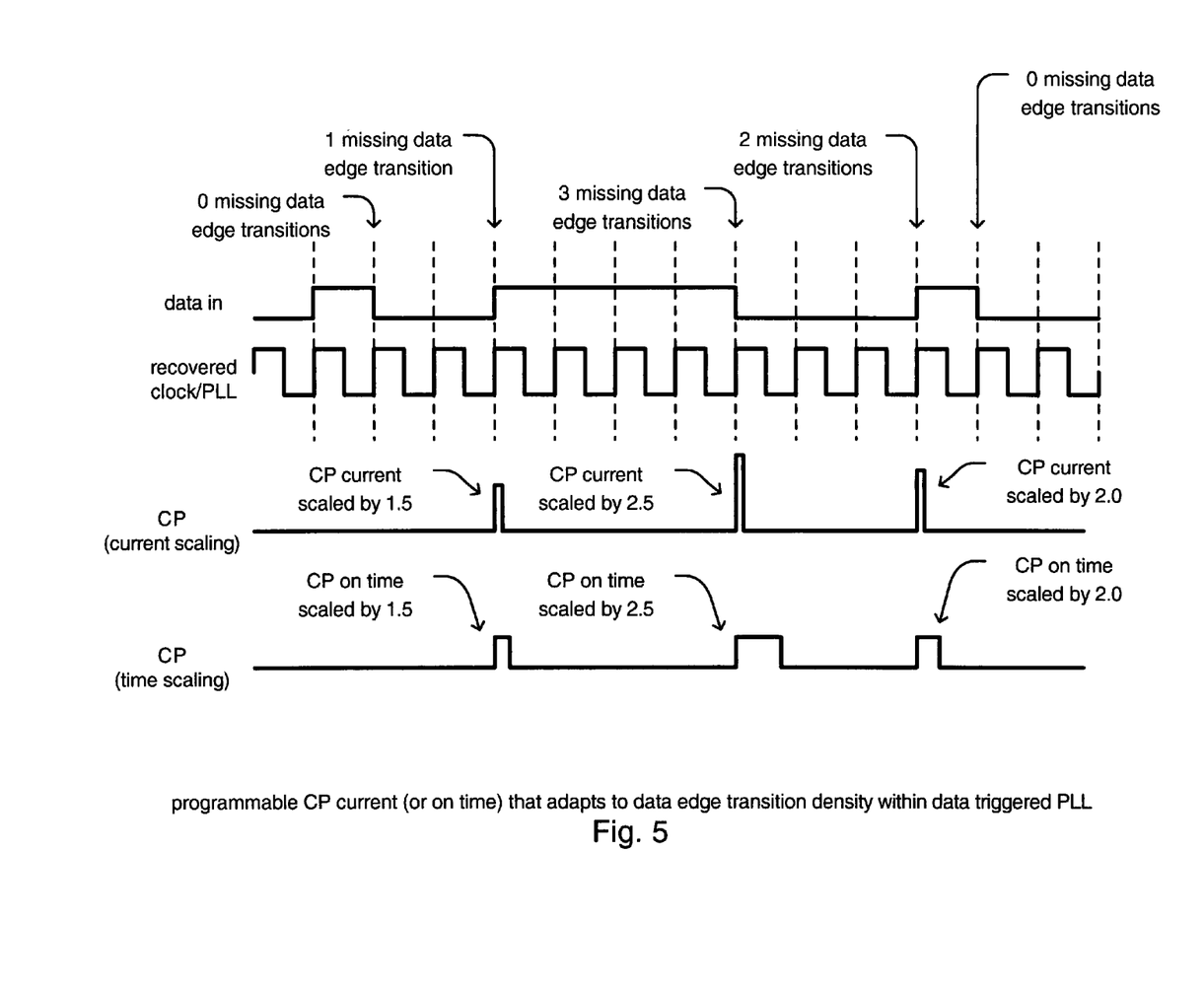
FIG. 5 is a diagram illustrating an alternative embodiment of programmable CP current (or on time) that adapts to data edge transition density within a data triggered PLL that is built according to the invention.

FIG. 5 is a diagram illustrating an alternative embodiment of programmable CP current (or on time) that adapts to data edge transition density within a data triggered PLL that is built according to the invention. This diagram shows in more detail the manner in which the CP current (shown as current scaling) or CP on time (shown as time scaling) may be performed in response to detected missing data edge transitions of the data signal that is used to trigger the PLL.

A recovered clock/PLL signal is shown as maintaining a virtually constant frequency and periodicity. When, no missing data edge transition has been detected, the CP current need not be scaled or the CP on time need not be scaled at all and the data triggered PLL remains in lock.

However, the data in signal then passes through a time period of 2 recovered clock/PLL cycles before a data edge transition is detected. Then, as a data edge transition is in fact detected, the CP current or CP on time is scaled by a factor of 1.5 based on the missing data edge transition count of 1 missing data edge transition.

The data in signal then passes through a time period of 4 recovered clock/PLL cycles before a data edge transition is detected. Then, as a data edge transition is in fact detected, the CP current or CP on time is scaled by a factor of 2.5 based on the missing data edge transition count of 3 missing data edge transitions.

The data in signal then passes through a time period of 3 recovered clock/PLL cycles before a data edge transition is detected. Then, as a data edge transition is in fact detected, the CP current or CP on time is scaled by a factor of 2.0 based on the missing data edge transition count of 2 missing data edge transitions.

This function continues indefinitely thereby ensuring lock of the PLL. The missing data edge transition count is continually monitored (kept and reset, appropriately) and used to scale the CP current or CP on time thereby maintaining lock within the data triggered PLL and also ensuring that the bandwidth of the data triggered PLL remains substantially constant for varying data signal transition densities.

Figure 6:
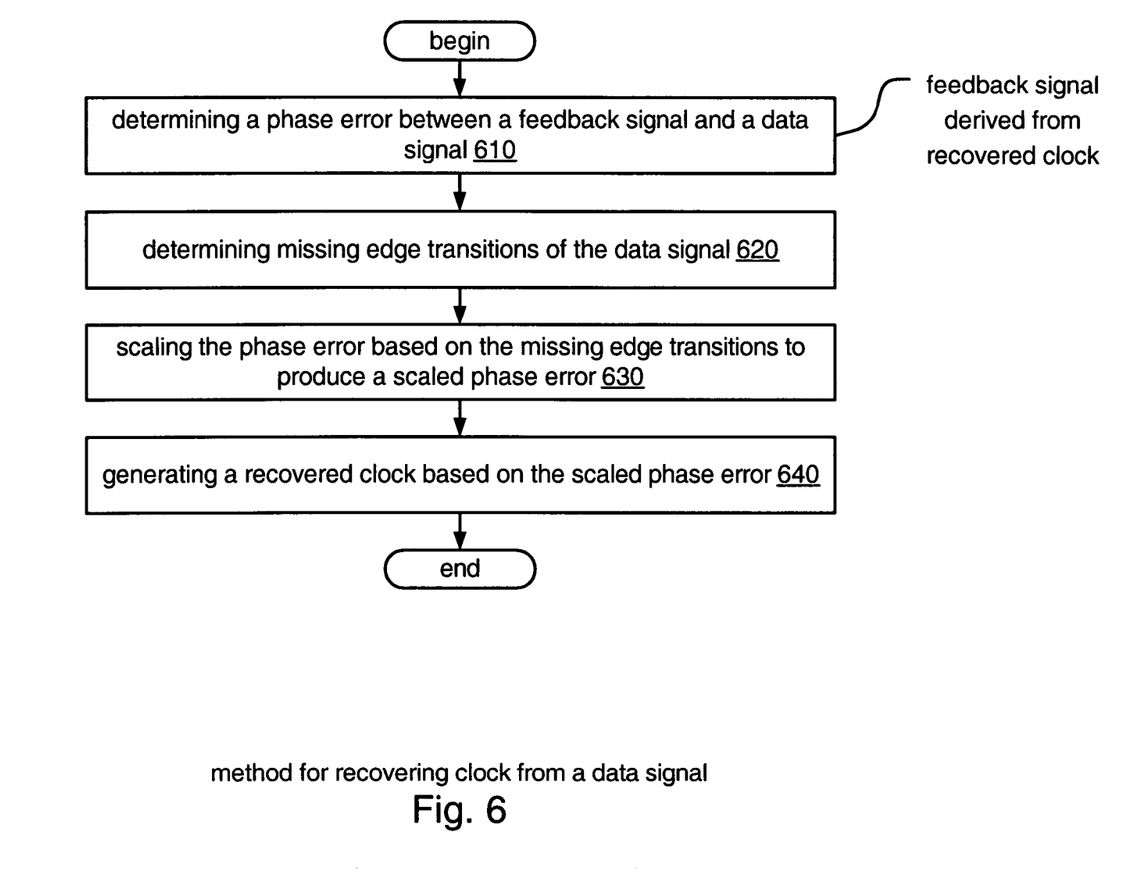
FIG. 6 is a flowchart illustrating an embodiment of a method for recovering a clock from a data signal according to the invention.

FIG. 6 is a flowchart illustrating an embodiment of a method for recovering a clock from a data signal according to the invention. The method involves determining a phase error between a feedback signal and the data signal as shown in a block 610. The feedback signal is derived from a recovered clock that is generated by the method (as described below). The method then involves determining missing data edge transitions of the data signal as shown in a block 620. The method then continues by scaling the phase error based on the missing data edge transitions to produce a scaled phase error as shown in a block 630. Finally, the method continues by generating a recovered clock based on the scaled phase error as shown in a block 640. Again, the feedback signal mentioned above is derived from the recovered clock.

Figure 7:
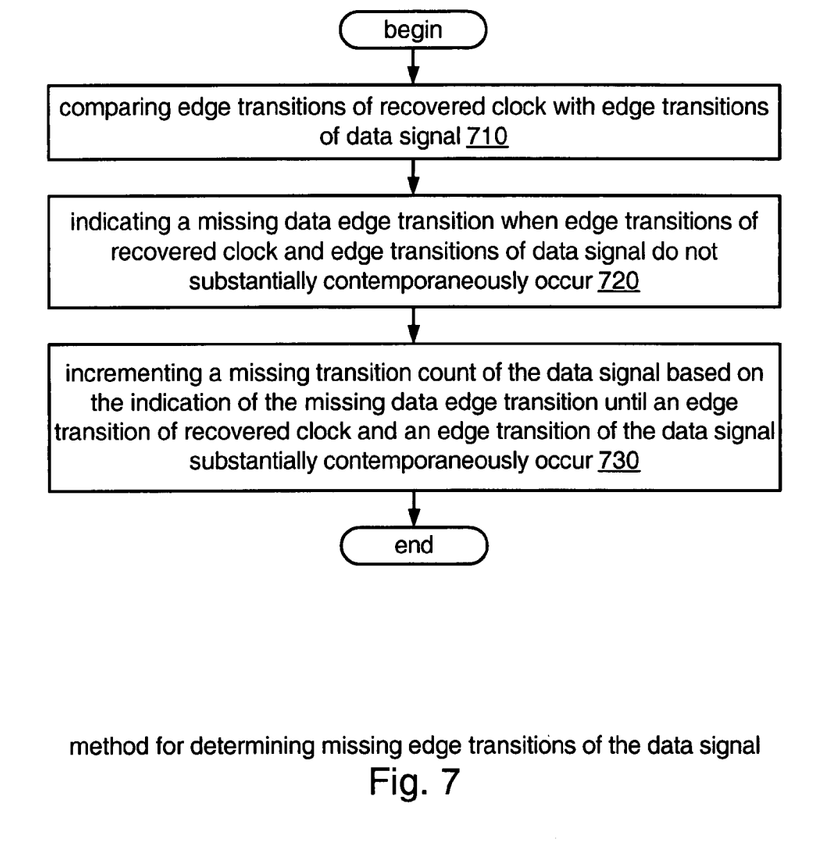
FIG. 7 is a flowchart illustrating an embodiment of a method for determining missing edge transitions of a data signal according to the invention.

FIG. 7 is a flowchart illustrating an embodiment of a method for determining missing edge transitions of a data signal according to the invention. This method may be viewed as being one possible embodiment by which the determination of the missing data edge transitions of the method described with respect to the preceding diagram is achieved.

The method involves comparing transitions of the recovered clock with data edge transitions of the data signal as shown in a block 710. When a transition occurs in the recovered clock and a substantially contemporaneous transition does not occur in the data signal, the method continues by indicating a missing transition of the data signal as shown in a block 720. Then, as shown in a block 730, the method continues by incrementing a missing data edge transition count of the data signal based on the indication of the missing data edge transition until a data edge transition of the data signal occurs substantially contemporaneously with another transition of the recovered clock to produce an accumulated missing transition count.

Figure 8:
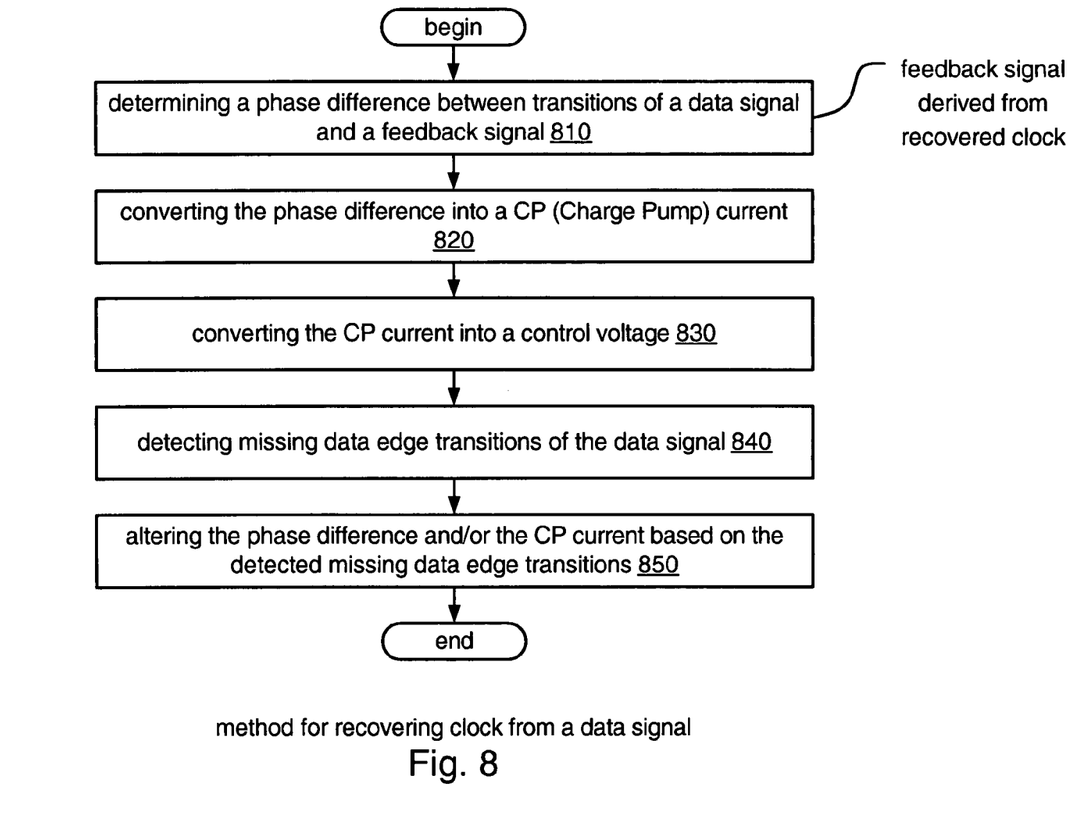
FIG. 8 is a flowchart illustrating an alternative embodiment of a method for recovering a clock from a data signal according to the invention.

FIG. 8 is a flowchart illustrating an alternative embodiment of a method for recovering a clock from a data signal according to the invention. This method may be performed within a data triggered PLL (Phase Locked Loop). The method involves determining a phase difference between transitions of a data signal and a feedback signal as shown in a block 810. As with the other embodiment described above with respect to another method for recovering a clock from a data signal, the feedback signal is derived from a recovered clock that is generated by the method. This determination of the phase difference between transitions of the data signal and the feedback signal may be performed within a phase detector. Then, as shown in a block 820, the method continues by converting a phase difference into a CP (Charge Pump) current; this may be performed appropriately within a CP as described in any of the appropriate embodiments herein. The method then continues by converting the CP current into a control voltage as shown in a block 830. This conversion of the CP current into a control voltage may be performed within a loop filter as described in any of the appropriate embodiments herein.

The method then continues by converting the control voltage into a recovered clock. Again, the feedback signal (mentioned above) is derived from the recovered clock. This conversion of the control voltage into the recovered clock may be performed within a VCO as described in any of the appropriate embodiments herein.

Then, as shown in a block 840, the method continues by detecting missing data edge transitions of the data signal, and the method uses those missing data edge transitions to direct the altering of the phase difference and/or the CP current (as shown in a block 850) such that bandwidth of a data triggered PLL remains substantially constant for varying data edge transition densities within a data signal. This detection of the missing data edge transitions of the data signal may be performed by an edge detection module as described in any of the appropriate embodiments herein.

It is also noted that the methods described within the preceding figures may also be performed within any of the appropriate system and/or apparatus designs (e.g., data triggered PLLs that may be implemented within various communication systems, communication devices, communication transceivers, communication receivers, and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A data triggered phase locked loop (PLL) comprises:
   phase detector operably coupled to determine a phase difference between transitions of a data signal and a feedback signal;
   charge pump operably coupled to convert the phase difference into a charge pump current;
   loop filter operably coupled to convert the charge pump current into a control voltage;
   voltage controlled oscillator operably coupled to convert the control voltage into a recovered clock, wherein feedback signal is derived from the recovered clock; and
   edge detection module operably coupled to detect missing transitions of the data signal and to alter at least one of the phase difference and charge pump current based on the missing transitions such that bandwidth of the data triggered PLL remains substantially constant for varying data signal transition densities, the missing transitions being detected by:
      comparing transitions of the recovered clock with transitions of the data signal;
      when a transition occurs in the recovered clock and a substantially contemporaneously transition does not occur in the data signal, indicating a missing transition of the data signal;
      incrementing a missing transition count of the data signal based on the indication of the missing transition until a transition of the data signal occurs substantially contemporaneously with another transition of the recovered clock to produce an accumulated missing transition count; and
      at each transition of the data signal, establishing a phase error scaling factor based on the accumulated missing transition count and a phase error-to-missing transition relationship by:
         establishing a normalized phase error in accordance with the accumulated missing transition count as the phase error-to-missing transition relationship, wherein the normalized phase error corresponds to $(n+2)/2$ for $[0 \ldots n]$, wherein n corresponds to a numerical value of the accumulated missing transition count; and
         summing the normalized phase error to produce the phase error scaling factor.

2. The data triggered PLL of claim 1, wherein the establishing the phase error scaling factor comprises:
   providing a mathematical function that relates phase error to number of missing transitions as the phase error-to-missing transition relationship; and
   solving the mathematical function for the accumulated missing transition count.

3. The data triggered PLL of claim 1, wherein the phase detector comprises:
   phase offset module operably coupled to provide a phase offset to at least one of phase of the data signal and phase of the feedback signal based on the phase error scaling factor to produce at least one of altered phase of the data signal and altered phase of the feedback signal; and
   up/down signal generation module operably coupled to produce:
   an up signal when:
      the altered phase of the data signal leads the phase of the feedback signal;
      the phase of the data signal leads the altered phase of the feedback signal; or
      the altered phase of the data signal leads the altered phase of the feedback signal; and
   a down signal when:
      the altered phase of the feedback signal leads the phase of the data signal;
      the phase of the feedback signal leads the altered phase of the data signal; or
      the altered phase of the feedback signal leads the altered phase of the data signal.

4. The data triggered PLL of claim 1, wherein the charge pump comprises:
   a variable current source operably coupled to provide a source current during a variable source current on time to the loop filter based on a first state of the phase difference that corresponds to when phase of the data signal leads phase of the feedback signal, wherein duration of the variable source current on time during which the variable current source provides the source current is based on the phase error scaling factor; and
   a variable current sink operably coupled to draw a sink current during a variable sink current on time from the loop filter based on a second state of the phase difference that corresponds to when the phase of the feedback signal leads the phase of the data signal, wherein duration of the variable sink current on time during which the variable current sink draws the sink current is based on the missing transitions.

5. A method for recovering a clock from a data signal, the method comprises:
   determining a phase error between a feedback signal and the data signal;
   determining missing transitions of the data signal;
   scaling the phase error based on the missing transitions to produce a scaled phase error, the scaling comprising:
      establishing a normalized phase error in accordance with the accumulated missing transition count, wherein the normalized phase error corresponds to $(n+2)/2$ for $[0 \ldots n]$, wherein n corresponds to a numerical value of the accumulated missing transition count; and
      summing the normalized phase error to produce the scaled phase error; and
   generating a recovered clock based on the scaled phase error, wherein the feedback signal is derived from the recovered clock;
   wherein the determining the missing transitions comprises:
      comparing transitions of the recovered clock with transitions of the data signal;
      when a transition occurs in the recovered clock and a substantially contemporaneous transition does not occur in the data signal, indicating a missing transition of the data signal; and
      incrementing a missing transition count of the data signal based on the indication of the missing transition until a transition of the data signal occurs substantially contemporaneously with another transition of the recovered clock to produce an accumulated missing transition count.

6. The method of claim 5, wherein the scaling the phase error comprises:
   providing a mathematical function that relates phase error to number of missing transitions; and
   solving the mathematical function for the accumulated missing transition count.

7. A computer readable medium storing instructions thereon for recovering a clock from a data signal, the instructions comprising:

determining a phase error between a feedback signal and the data signal;

determining missing transitions of the data signal;

scaling the phase error based on the missing transitions to produce a scaled phase error, the scaling comprising:

establishing a normalized phase error in accordance with the accumulated missing transition count, wherein the normalized phase error corresponds to $(n+2)/2$ for $[0 \ldots n]$, wherein n corresponds to a numerical value of the accumulated missing transition count; and summing the normalized phase error to produce the scaled phase error; and generating a recovered clock based on the scaled phase error, wherein the feedback signal is derived from the recovered clock;

wherein determining the missing transitions further comprises:

comparing transitions of the recovered clock with transitions of the data signal;

when a transition occurs in the recovered clock and a substantially contemporaneous transition does not occur in the data signal, indicating a missing transition of the data signal; and incrementing a missing transition count of the data signal based on the indication of the missing transition until a transition of the data signal occurs substantially contemporaneously with another transition of the recovered clock to produce an accumulated missing transition count.

8. The computer readable medium of claim 7, wherein scaling the phase error further comprises:

providing a mathematical function that relates phase error to number of missing transitions; and solving the mathematical function for the accumulated missing transition count.

* * * * *